(12) United States Patent
Smith et al.

(10) Patent No.: US 7,393,712 B2
(45) Date of Patent: Jul. 1, 2008

(54) FLUIDIC MEMS DEVICE

(75) Inventors: Mark A. Smith, Corvallis, OR (US); William R Boucher, Corvallis, OR (US); Charles C Haluzak, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 54 days.

(21) Appl. No.: 11/350,662

(22) Filed: Feb. 8, 2006

(65) Prior Publication Data

US 2007/0042565 A1    Feb. 22, 2007

Related U.S. Application Data

(63) Continuation of application No. 10/620,968, filed on Jul. 15, 2003, now abandoned.

(51) Int. Cl.
*H01L 21/00* (2006.01)

(52) U.S. Cl. .............. 438/51; 438/26; 438/52; 438/53; 257/E21.502; 257/E21.503

(58) Field of Classification Search ............ 438/51
See application file for complete search history.

(56) References Cited

U.S. PATENT DOCUMENTS

| | | | |
|---|---|---|---|
| 5,130,889 A | | 7/1992 | Hamburgen et al. |
| 5,165,956 A | | 11/1992 | Wong |
| 5,317,196 A | | 5/1994 | Wong |
| 5,324,888 A | | 6/1994 | Tyler et al. |
| 5,399,805 A | * | 3/1995 | Tyler et al. ............ 174/529 |
| 5,473,512 A | | 12/1995 | Degani et al. |
| 5,568,684 A | | 10/1996 | Wong |
| 6,020,219 A | | 2/2000 | Dudderar et al. |
| 6,297,072 B1 | * | 10/2001 | Tilmans et al. ............ 438/106 |
| 6,556,261 B1 | | 4/2003 | Krusius et al. |
| 6,624,003 B1 | | 9/2003 | Rice |
| 6,806,993 B1 | * | 10/2004 | Adams et al. ............ 359/291 |
| 6,858,466 B1 | * | 2/2005 | Bower et al. ............ 438/106 |
| 6,917,099 B2 | | 7/2005 | Hellekson et al. |
| 6,951,769 B2 | * | 10/2005 | Malone ............ 438/51 |
| 6,953,985 B2 | | 10/2005 | Lin et al. |
| 2002/0072163 A1 | | 6/2002 | Wong et al. |
| 2002/0075551 A1 | | 6/2002 | Daneman et al. |

(Continued)

FOREIGN PATENT DOCUMENTS

EP    0 951 068 A    10/1999

(Continued)

OTHER PUBLICATIONS

Larsen et al, "SOI silicon on glass for optical MEMS", 2003 IEEE, pp. 1655-1658.

(Continued)

*Primary Examiner*—David A Zarneke (57) ABSTRACT

A method of manufacturing a fluidic MEMS package includes attaching a cover plate with a plurality of openings to a substrate with a plurality of bond rings with breaches such that the cover plate, the substrate and the bond rings define a plurality of respective inner cavities. The cover plate, the substrate and the breaches define a plurality of respective fill ports. The method also includes filling the inner cavities with fluid, sealing the fluid in the inner cavities, and singulating a plurality of MEMS packages from the substrate.

15 Claims, 7 Drawing Sheets

U.S. PATENT DOCUMENTS

2003/0054588 A1   3/2003   Patel et al.

FOREIGN PATENT DOCUMENTS

| WO | WO 97/03459 | 1/1997 |
| WO | WO 03/054925 A | 7/2003 |

OTHER PUBLICATIONS

Tilmans et al, "The indent reflow sealing (IRS) technique—A method for the fabrication of sealed cavities of MEMS devices", 2000 IEEE.
LCOS 2001 Industry Report; published Jun. 2001; Insight Media.
Merriam-Websters Ninth New Collegiate Dictionary, 1987, pp. 475.

\* cited by examiner

FLUIDIC MEMS DEVICE

CROSS-REFERENCE TO RELATED APPLICATIONS

This Application is a continuation of commonly assigned U.S. patent application Ser. No. 10/620,968 filed Jul. 15, 2003 and hereby incorporated by reference.

BACKGROUND OF THE DISCLOSURE

Certain fluidic micro-electro-mechanical systems (MEMS) applications include fluid in a hermetically sealed inner cavity of a MEMS package. Such hermetic MEMS packages may comprise rigid and/or brittle materials. The volumetric expansion rate of fluids hermetically sealed in MEMS packaging, upon increases in temperature, may be as much as 20 to 100 times greater, for example, than the expansion rate of the inner cavity of the package based on the linear expansion rate of the packaging materials. The fluid may also be incompressible or have a very low degree of compressibility. As a result, thermal excursions may result in an increase of fluid pressure in the inner cavity which may lead to fluid leakage and/or fracture of the packaging materials.

SUMMARY OF THE DISCLOSURE

An exemplary embodiment of a MEMS package comprises a substrate and a cover plate. A MEMS structure is fabricated on the substrate. The cover plate may be bonded to the substrate by a bond ring. The cover plate, the bond ring and the substrate may define an inner cavity. The cover plate, the substrate and a breach in the bond ring may define a fill port.

BRIEF DESCRIPTION OF THE DRAWINGS

These and other features and advantages of the invention will readily be appreciated by persons skilled in the art from the following detailed description of exemplary embodiments thereof, as illustrated in the accompanying drawings, in which.

DETAILED DESCRIPTION OF THE DISCLOSURE

In the following detailed description and in the several figures of the drawing, like elements are identified with like reference numerals.

FIGS. 1 through 4 illustrate exemplary embodiments of MEMS package assemblies suitable for use as fluidic MEMS devices. A MEMS assembly or package 1 includes a cover plate 2, a substrate 3 and a bond ring 4. A primary face 21 (FIG. 3) of the cover plate 2 is attached to a primary surface 31 of the substrate by a bond ring 4. The cover plate 2 may be an optical window or aperture and may comprise silicon, glass, plastic, metal or metal alloys, such as Kovar (™), or other suitable material. The substrate 3 may be a silicon substrate and may have a MEMS structure 32 fabricated on the primary surface 31. The bond ring 4 may be an inorganic bond ring. The cover plate may be smaller than the substrate and may define exposed portions 33 on the substrate which are not covered by the cover plate. Electrical bonding pads 34 for making electrical connections to the MEMS may be arranged in the exposed portions 33 on the substrate.

Figure 1:
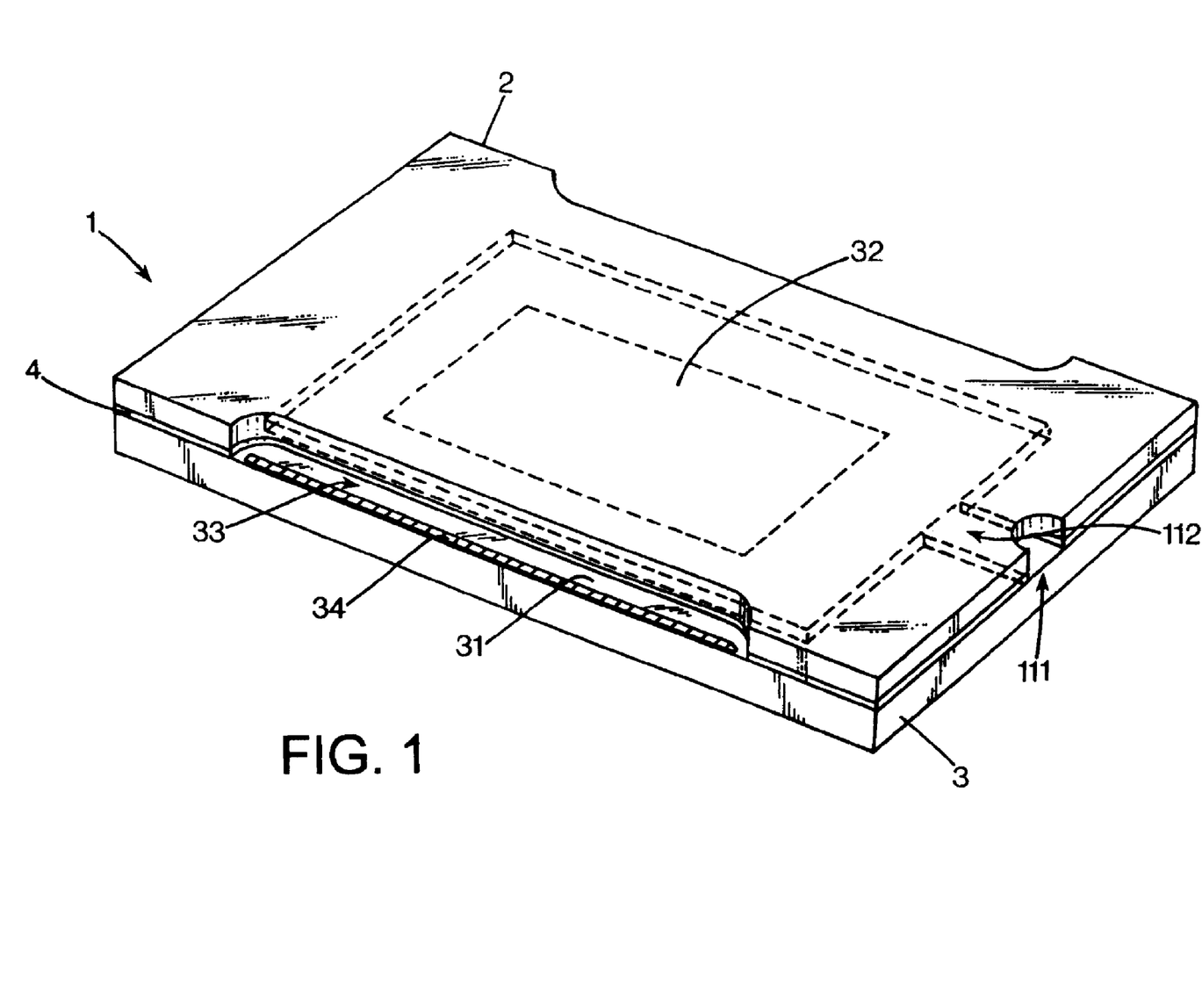
FIG. 1 illustrates an exemplary embodiment of a MEMS assembly capable of being assembled using a Awafer-scale@ method.
Figure 2:
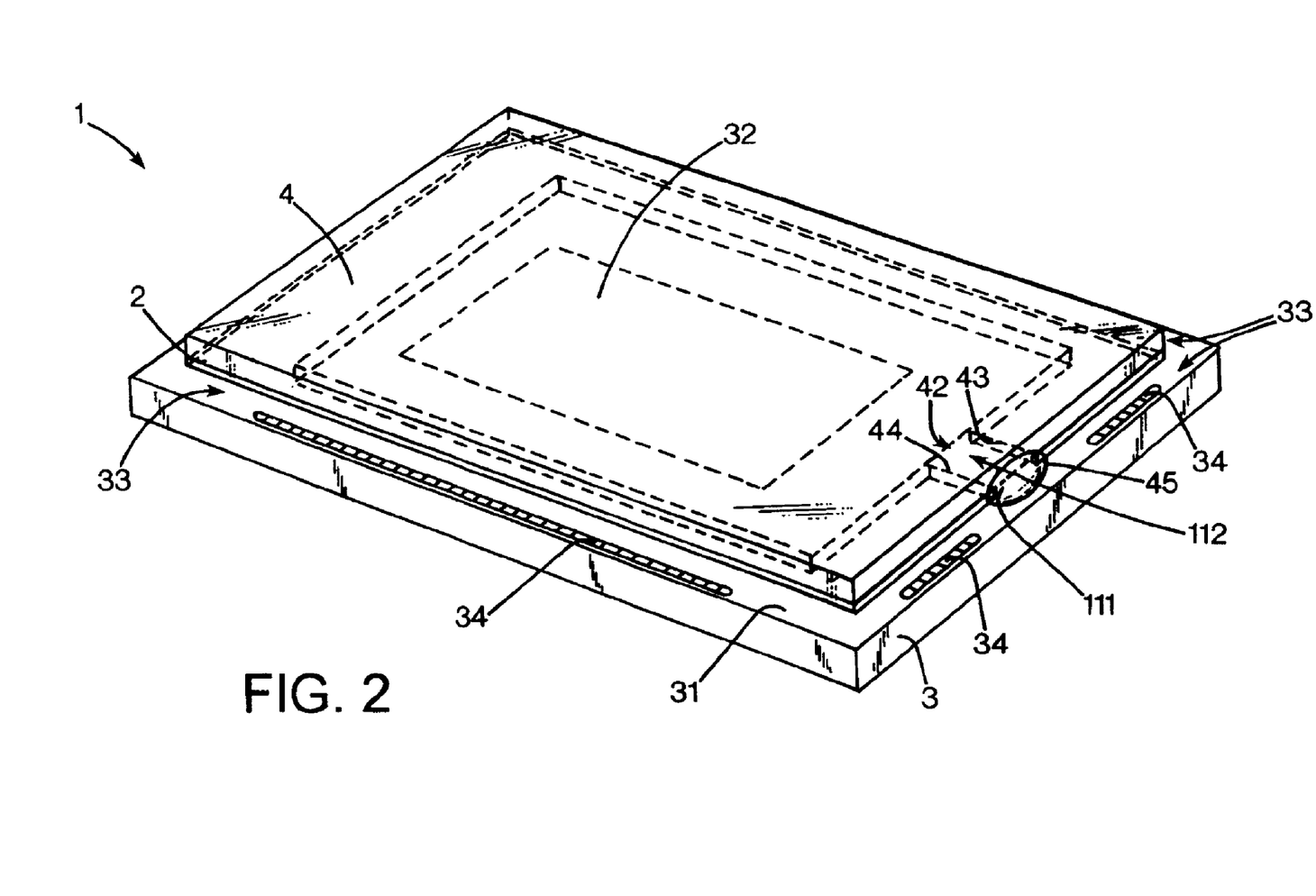
FIG. 2 illustrates an exemplary embodiment of a MEMS assembly capable of being assembled using a Apick-and-place@ method.
Figure 3:
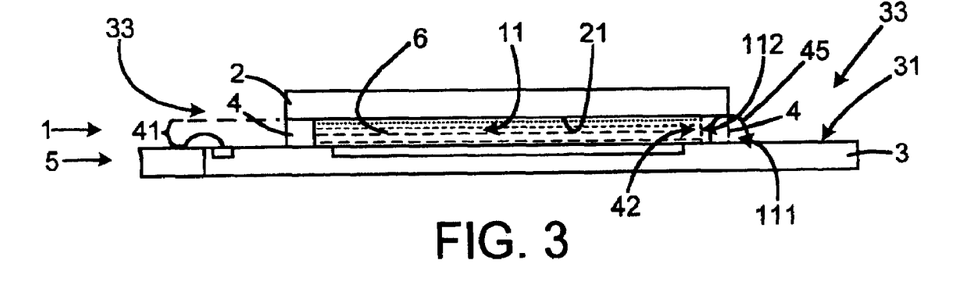
FIG. 3 illustrates a cross-sectional view of an exemplary embodiment of a fluidic MEMS assembly.
Figure 4:
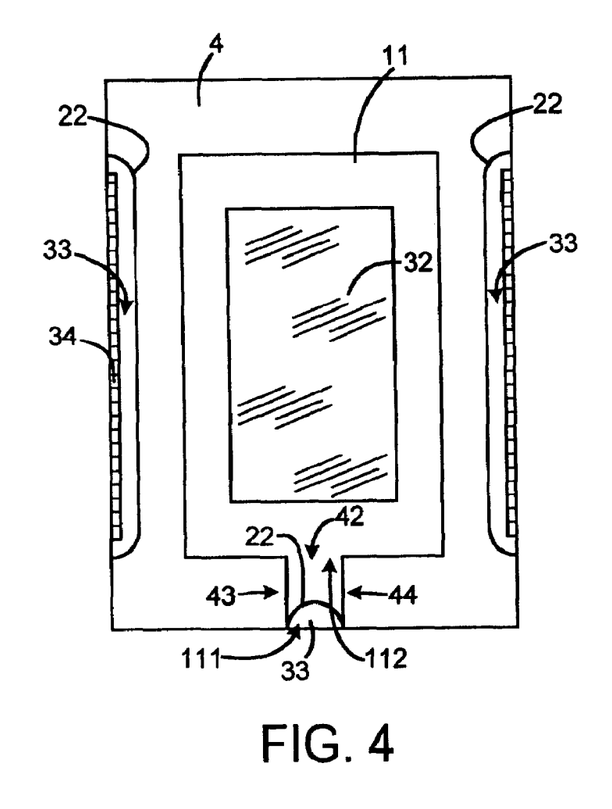
FIG. 4 illustrates a plan view of an exemplary embodiment of a MEMS assembly.

The exposed portions 33 may be defined in an opening 22, for example a slot or hole in the cover plate, or may be defined in a partial slot or hole which, for example, may remain in a cover plate after singulation from a wafer-scale assembly (FIGS. 1 and 4) as described further below. The bonding pads 34 may be electrically connected, for example, to a printed circuit board (PCB) 5 (FIG. 3). The exposed portions may alternatively be defined by the cover plate being smaller than the substrate such that exposed portions of the substrate that extend beyond the edges of the cover plate (FIGS. 2 and 3).

In an exemplary embodiment illustrated in FIG. 3, the primary surface 31 of the substrate 3, the primary face 21 of the cover plate 2 and the bond ring 4 define an inner cavity 11. The height 41 of the inner cavity 11 may be about 3 to 10 microns. A breach 42 between two ends 43, 44 (FIG. 2) in the bond ring 4 defines a fill port 111 and fill path 112 into the inner cavity 11. The bond ring may comprise, for example, a glass frit, adhesives, eutectic solders, solder mask materials, anodic bond, covalent bond, laser weld, Sol-gel materials or other material suitable for bonding between the substrate and the cover plate. A eutectic solder may, for example, comprise an AuSn eutectic solder.

Exemplary fluidic MEMS devices may be assembled using various techniques. In one exemplary process, a cover plate is attached by a bond ring to a substrate to define an inner cavity. The size of the substrate and cover plate may be chosen to permit access to bond pads in exposed areas of the substrate. For example, the cover plate may be smaller than the substrate defining exposed portions of the primary surface of the substrate after the cover plate is attached. The exemplary embodiment illustrated in FIG. 2 may be assembled using this method. This method is an exemplary embodiment of a Apick-and-place@ method in which individual cover plates are picked up and attached individually to a substrate.

Figure 5:
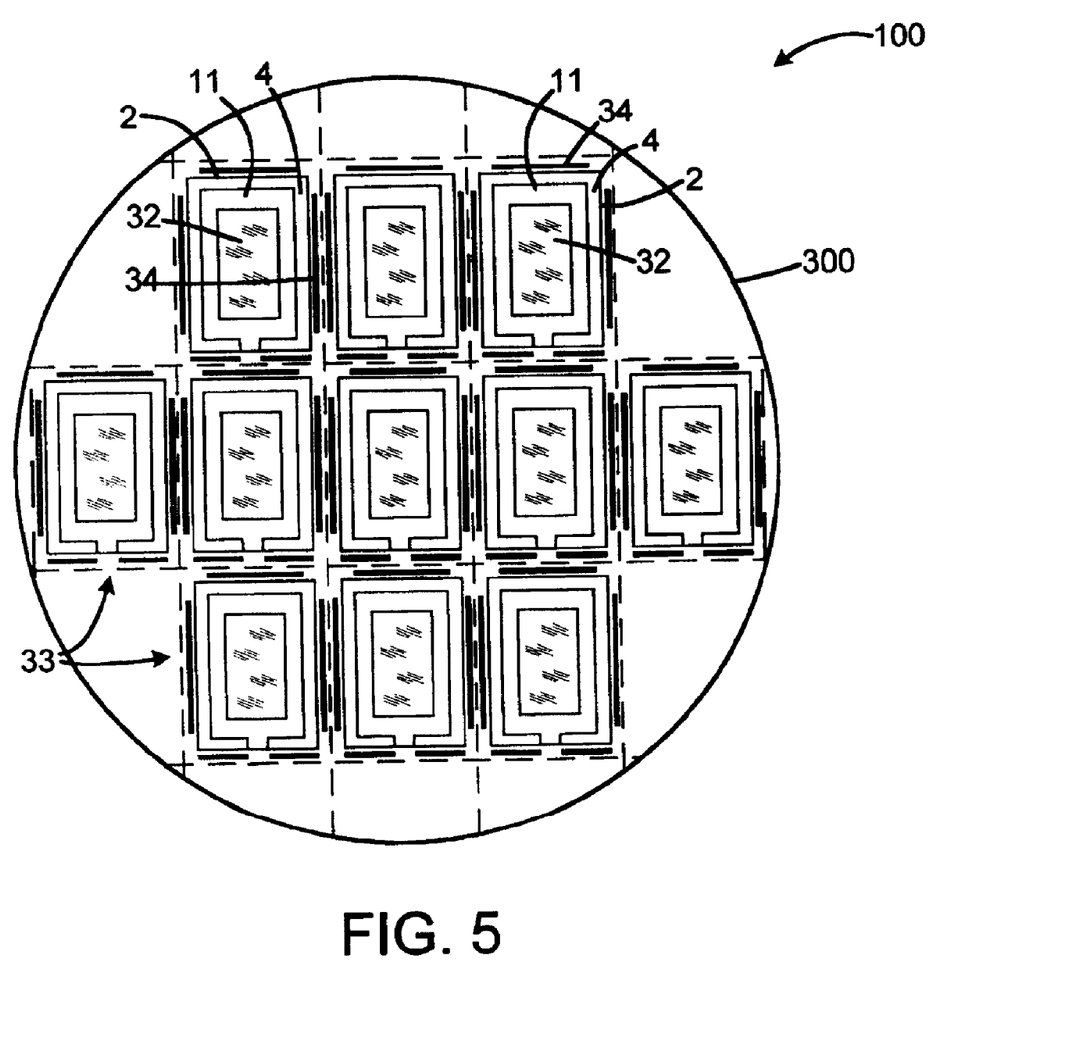
FIG. 5 illustrates a plan view of a wafer-level MEMS assembly used in an exemplary pick-and-place method of manufacturing exemplary fluidic MEMS assemblies.

In an alternate pick-and-place embodiment illustrated in FIG. 5, a plurality of cover plates 2 may attached to a substrate 300 with a plurality of MEMS structures 32 at a plurality of die locations 35 on the substrate to form a MEMS assembly 100. The substrate 300 may be a silicon wafer with a plurality of MEMS structures fabricated on a surface of the substrate.

Each MEMS structure may be located at a die location. Each die location adapted to form individual MEMS dies when singulated from the wafer. In FIG. 5, the die locations 35 are indicated by the rectangles defined by the grid-lines on the wafer.

Each cover plate 2 is attached to the wafer 300 by a bond ring 4 at a die location 35. The wafer 300, the cover plates 2 and the bond rings 4 define a plurality of inner cavities. Bond pads 34 are provided for making electrical connections to the MEMS device structures. Individual MEMS devices or dies may be singulated from the wafer after the cover plates are attached. Attaching the cover plates at the wafer level may provide some protection to the MEMS structures on the substrate during any subsequent manufacturing, assembly or handling. The individual MEMS devices could be filled with fluid at the wafer level, prior to singulation, as discussed below. The exemplary embodiments illustrated in FIGS. 2 or 3 may be assembled using this method.

Figure 6A:
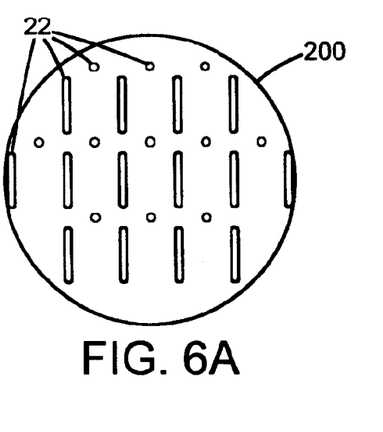
FIGS. 6A, 6B and 6C illustrate a cover plate, wafer and wafer-level MEMS assembly, respectively, each used in an exemplary, wafer-scale method of manufacturing exemplary embodiments of fluidic MEMS assemblies.
Figure 6B:
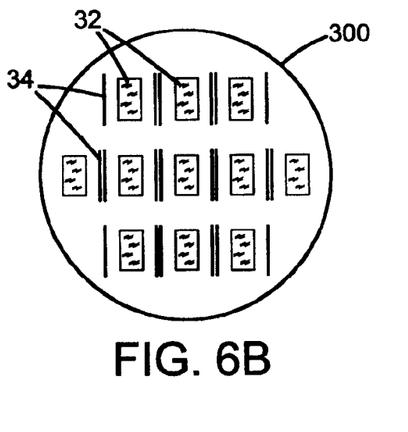
Figure 6C:
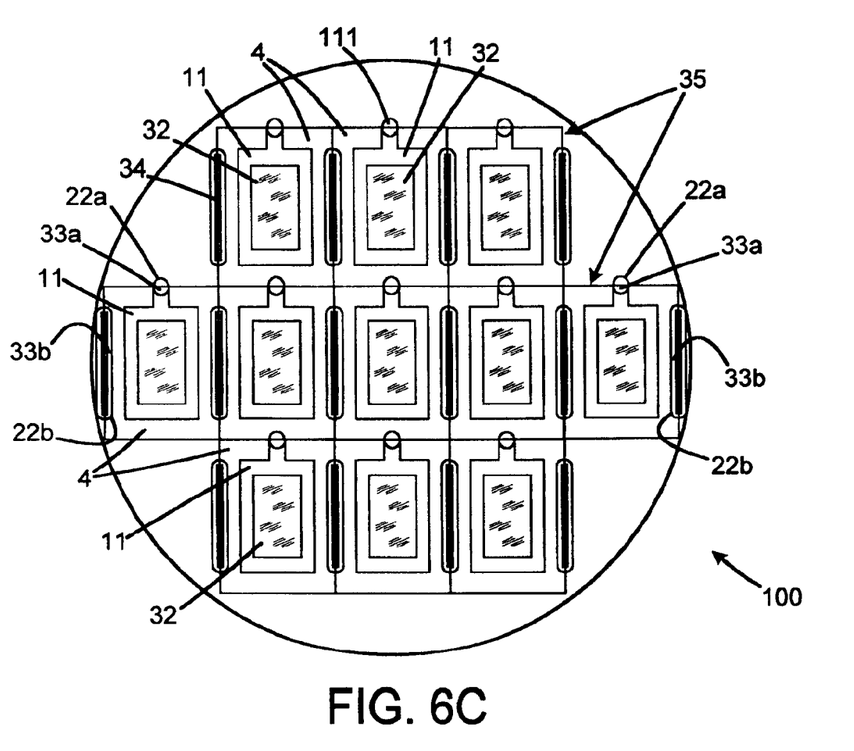

In an alternate Awafer-scale@ embodiment illustrated in FIGS. 6A-6C, a cover plate 200 with a plurality of openings 22 (FIG. 6A), which may for example comprise slots and/or holes, may be attached to a substrate or wafer 300 with a plurality of MEMS structures 32 and bond pads 34 (FIG. 6B) to form a MEMS assembly 100 (FIG. 6C). The cover plate 200 may be attached to the wafer 300 by a plurality of bond rings 4. The cover plate, the wafer and the bond rings may define a plurality of inner cavities 11. The plurality of inner cavities may correspond to a plurality of die locations 35. A plurality of individual MEMS devices or dies may be singulated from the wafer level assembly 100. The exemplary embodiments illustrated in FIG. 1 or 4, for example, may be assembled using this method. Although the substrate in the embodiment illustrated in FIGS. 6A-6C is described as a wafer, it is understood that the method may be used with any substrate with a plurality of MEMS structures fabricated at a plurality of die locations 35 on a surface of the substrate. It is also understood that the plurality of bond rings 4 may comprise fewer contiguous segments of bond ring material than the number of inner cavities defined. A single, contiguous amount of bond ring material, for example, could define a plurality of bond rings.

The openings 22 may provide access to fill ports 111 for filling and sealing, as discussed below, and/or access to bond pads 34 for making electrical connections. When the cover plate is attached to the wafer, the access openings define exposed portions on the primary surface of the substrate or wafer. In the exemplary embodiment of FIGS. 6A-6C, a group of openings 22a in the form of holes define a first group of exposed portions 33a adjacent to fill ports 111. A second group of openings 22b in the form of slots define a second group of exposed portions 33b. Bond pads 34 are arranged on the exposed portions 33b.

The exposed portions 33a at the fill ports may provide access to fill the inner cavity through the fill port, may provide a platform adapted to receive fluid to be provided for use in filling the inner cavity and may provide a platform for placing a seal at the fill port after filling the inner cavity. Exposed portions 33 adjacent fill ports in other exemplary embodiments may also provide a platform for providing fluid for use in filling the inner cavity and may provide a platform for placing a seal at the fill port after filling the inner cavity. The exposed portions 33b on which the bond pads 34 are arranged provide access to the bond pads to make electrical connections to the individual MEMS devices or dies after singulation from the assembly 100. Exposed portions 33 in other exemplary embodiments may also provide access to bond pads to make electrical connections to MEMS devices.

In the exemplary embodiment illustrated in FIGS. 6A-6C, the openings 22a define exposed portions 33a at the fill ports only and each one defines an exposed portion at one fill port. The openings 22b define exposed portions 34b only where bond pads are arranged. It is understood that the openings could be arranged to define exposed portions for more than one fill port and that openings could be arranged to define exposed portions that are adjacent a fill port and on which bond pads are arranged. Where certain openings define such dual purpose exposed portions, such dual purpose exposed portions could be members of the group of openings which define exposed portions adjacent fluid ports and members of the group of openings defining exposed portions on which bond pads are arranged.

In an exemplary embodiment of a MEMS device 1, it may be desirable to fill the inner cavity 11 with fluid 6. Such fluidic MEMS device applications include without limitation micromirror arrays, micromotors, microswitches or accelerometers. Fluids used in these applications may comprise aromatic solvents, such as 1,1, Diphenylethylene, organosilianes, such as 3-chloropropyl triethoxysilane, perfluoroethers, such as Galden HT-100 (™), silicones and silanes, such as polymethylphenylsiloxane, and polydimethylsiloxane, water, mixtures of water and water-soluble organics, ionic materials dissolved in water, pigmented fluids, colloidal suspensions.

Figure 7A:
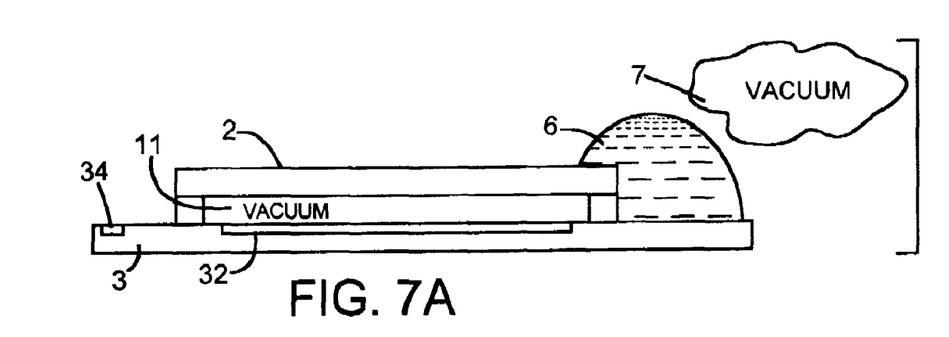
FIGS. 7A, 7B and 7C illustrate cross-sectional views of an exemplary embodiment of a fluidic MEMS assembly at various stages of fluid fill in an exemplary method of manufacturing a fluidic MEMS assembly.
Figure 7B:
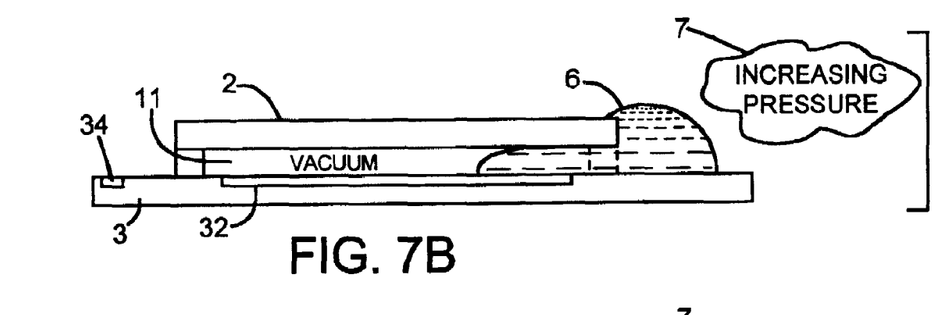
Figure 7C:
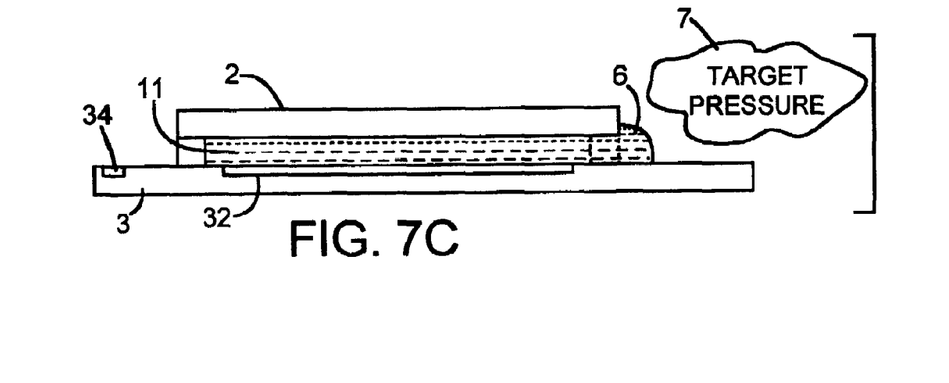
Figure 8A:
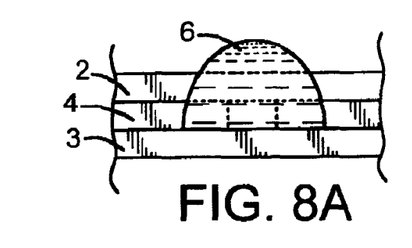
FIGS. 8A, 8B and 8C illustrate a front view of the exemplary embodiment of a fluidic MEMS assembly shown in FIGS. 7A, 7B and 7C.
Figure 8B:
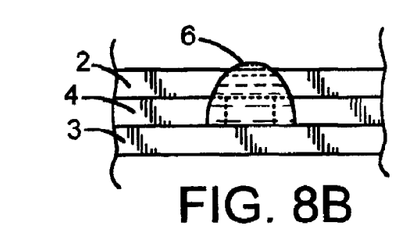
Figure 8C:
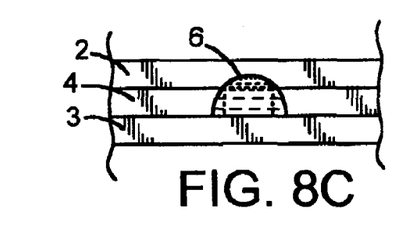

Fluid may be introduced into an inner cavity by a method illustrated in FIGS. 7 and 8. A low pressure, vacuum environment is provided in the inner cavity. The vacuum in the inner cavity may be provided by providing an environment 7 at a vacuum encompassing the MEMS assembly 1 which can be accomplished, for example, by placing the MEMS assembly into a chamber and evacuating air from the chamber to create a vacuum. The low pressure or vacuum environment 7 encompassing the MEMS assembly causes air located within the inner cavity to exit the inner cavity through the fill port 111, thereby providing the vacuum in the inner cavity. The low pressure or vacuum environment could be provided, alternatively, by assembling the assembly within a low pressure or vacuum environment.

When the inner cavity is provided with a vacuum, an amount of fluid at least sufficient to fill the inner cavity may be provided at the feed port 111. In an exemplary embodiment illustrated in FIG. 9a, the fluid 6 can be provided at the feed port by submerging the MEMS assembly in fluid 6. In another exemplary embodiment illustrated in FIG. 9b, the MEMS assembly could be submerged in the fluid 6 at a. and removed, leaving the amount of fluid 6 at least sufficient to fill the inner cavity at the feed port at b. In yet another exemplary embodiment illustrated in FIG. 9c, the fluid 6 could be provided at the feed port using a fluid carrier 61 which has been dipped into the fluid at a., moved at b., and touched to the fill port at c., leaving at least the desired amount of fluid at the fill port. The fluid carrier may comprise a pin or a capillary tube. A plurality of fluid carriers may be used to provide a sufficient amount of fluid to a plurality of fill ports simultaneously.

The fluid provided at the fluid port should be arranged such that an increase in the pressure of the environment 7 surrounding the MEMS assembly or in the chamber causes fluid to enter the inner cavity through the feed port. In an exemplary embodiment illustrated in FIGS. 7 and 8, for example, the fluid provided at the feed port spans the entire entrance to the fill port. While fluid is provided at the fill port, the pressure inside the inner cavity is initially the same as the pressure in the environment 7 surrounding the MEMS assembly. The pressure of the environment 7 surrounding the MEMS assembly is increased creating a pressure gradient across the fluid from the exposed portion to the portion in contact with the inner cavity. If the amount of fluid provided at the fill port is sufficient to fill the cavity and to provide a seal during the entire fill process, the fluid will fill the inner cavity. A residual amount of fluid may remain at the fill port after filling. The pressure of the environment is raised to a target pressure which, for example, may be atmospheric pressure or greater than atmospheric pressure.

The rate of pressure increase should be selected such that the differential pressure between the increased pressure in the environment or chamber and the low pressure or vacuum in the inner cavity causes the fluid to enter the cavity through the breach in the bond ring and completely fill the space between the silicon wafer and the cover plate. For viscous fluids, the fill time may be dominated by the time it takes the fluid to work its way in through the fill port. For fluids of lower viscosity, the fill time may be dominated by the time it takes to fully create the vacuum and evacuate air from the chamber and/or the inner cavity. A variety of factors may influence the length of the fill process, including fluid viscosity, temperature, fill port geometry, gap height, surface tension between the fluid and the cavity surfaces, and/or MEMS geometry. The duration of the fill process may be decreased by using higher than atmospheric pressure to increase the flow rate into the cavity.

The pressure of the environment or the chamber may be increased while the MEMS assembly is completely submerged in fluid or when the MEMS assembly has been removed from the liquid, leaving amounts of fluid sufficient for filling the cavities at the fill ports, or after a sufficient amount of fluid has been placed at the fill ports by other means. The amount of fluid provided at the fill port should be sufficient to fill the inner cavity and to prevent the introduction of air and/or gas into the inner cavity during the fill process. Where the MEMS assembly is submerged in fluid, the pressure due to the fluid alone may cause some fluid to enter the inner cavity before the pressure of the environment is increased. Capillary forces may also contribute to causing fluid to enter the inner cavity. The wafer is cleaned of excess fluid by an appropriate method, for example using a solvent, evaporation or wiping.

Certain alternative, optional embodiments may include several purge cycles with a gas or gasses, for example, carbon dioxide or helium, to help ensure that all of the air is removed from the inner cavity. Purge gases suitable for use in purging the inner cavity may be selected so that the gas or gases have high solubility in the fluid, the gases are inert with respect to the fluid and with respect to other materials present in the inner cavity. Suitable gases may comprise helium or carbon dioxide. In those embodiments in which a purge gas is used, the use of purge gases with high solubility in the fluid helps reduce the formation of residual gas bubbles in the fluid. The fluid used to fill the inner cavity may also be degassed prior to filling. Degassing the fluid may prevent absorbed gas from coming out of solution and nucleating a bubble in the fluid.

In exemplary embodiments, it may be desirable to remove adsorbed fluid, which may comprise water, from the surfaces of the inner cavity. The adsorbed fluid may be removed during the evacuation step. Elevated temperatures may be used to speed up the removal of adsorbed fluid.

Figures 9A, 9B, 9C, 10:
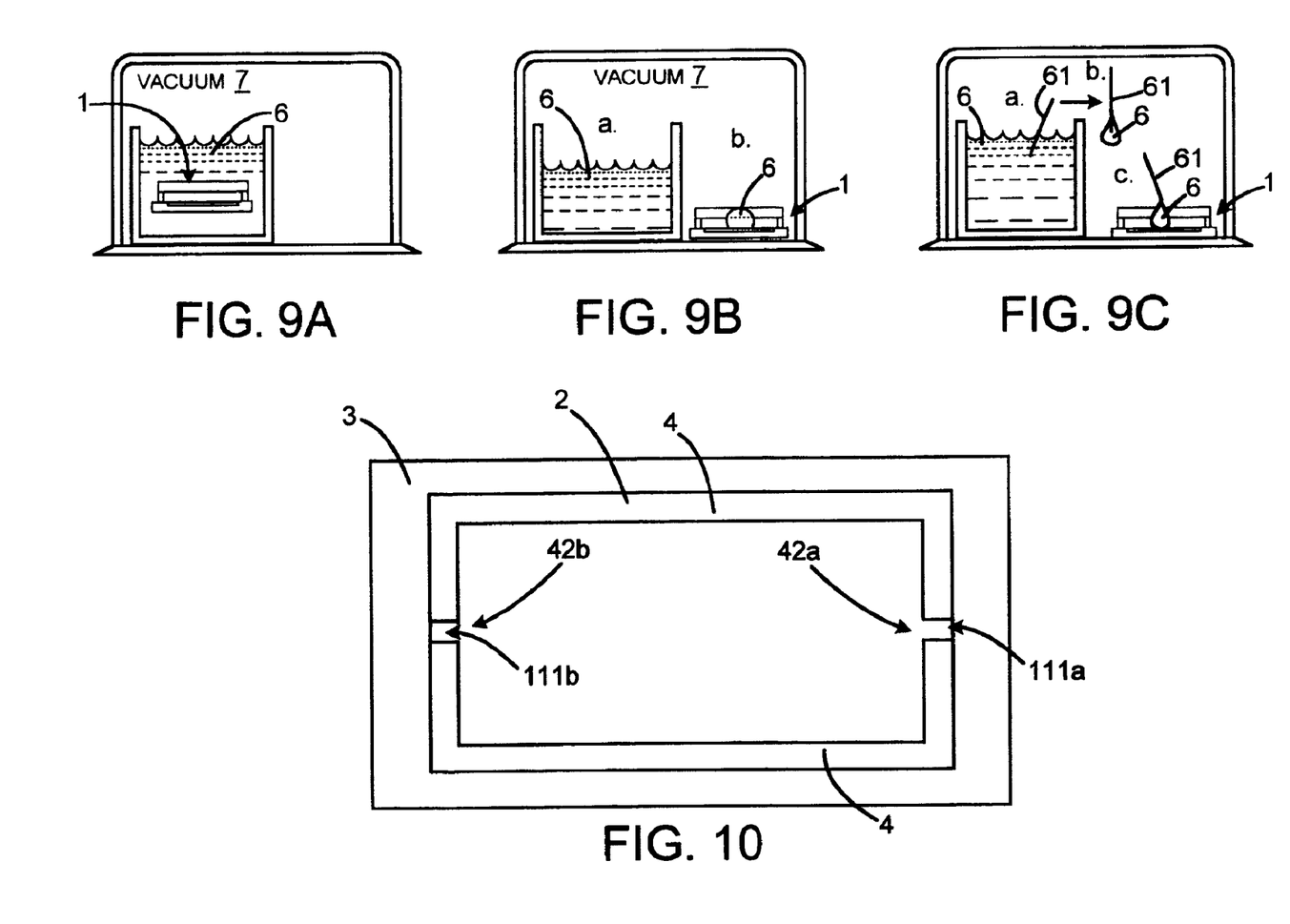
FIGS. 9A, 9B and 9C illustrate alternate exemplary embodiments of methods of filling fluidic MEMS devices.
FIG. 10 illustrates an exemplary embodiment of a fluidic MEMS assembly with a fill port and an evacuate port.

In an alternative exemplary embodiment, capillary forces alone may be sufficient to fill the cavity without using a vacuum. The MEMS assembly may comprise a bond ring with a plurality of breaches, for example two breaches. FIG. 10 illustrates an exemplary embodiment of a fluidic MEMS assembly comprising a substrate 3, a cover plate 2 and a bond ring 4. The bond ring 4 has two breaches 42a, 42b which define a fill port 111a and an evacuate port 111b. An amount of fluid sufficient to fill the inner cavity is provided at the fill port. The fluid is drawn into the inner cavity by capillary forces. Air from the inner cavity displaced by fluid drawn into the cavity is evacuated through the evacuate port. 111b. When the inner cavity is filled, the fill port and evacuate port are sealed. A fluidic MEMS assembly may alternatively be filled using pressure at the fill port, a vacuum at the evacuate port and/or capillary forces, alone or in combination.

An amount of adhesive, which may be curable adhesive, is applied to the location of the breach or breaches and cured to complete the containment of the fluid. Suitable adhesives may comprise organic adhesives, such as epoxies, which are thermally or UV cured, solders or glass-based sealants. Suitable sealants may be chemically inert or compatible with the fluid, may have a thermal expansion coefficient compatible for use with other components, may have good adhesion to all surfaces, high reliability, hermeticity. In the exemplary embodiments illustrated in FIGS. 2 and 3, a MEMS assembly with a cover plate 2, a substrate 3, a bond ring 4 with a breach and filled with fluid 6 includes a seal 45 at the fill port 111.

The height 41 of the inner cavity may be selected such that the volume of the fluid contained within the inner cavity is sufficiently small so that the change in volume upon expansion is sufficiently small to be accommodated by a slight deflections of the cover plate, substrate, bond ring, adhesive seal, thereby reducing the risk of damage to the cover plate.

In an exemplary embodiment of the fluidic MEMS device and method of manufacturing a fluidic MEMS device, a plurality of inner cavities defined on a wafer may be filled with fluid simultaneously. In one exemplary embodiment, a plurality of cover plates may be individually attached to each die location on a single substrate or wafer, as illustrated in FIG. 5. In a further exemplary embodiment, a single cover plate may be attached to a single substrate by a plurality of separate bond rings to define a plurality of inner cavities, as illustrated in FIGS. 6A-6C. In each one of these embodiments, the plurality of inner cavities may be filled at the same time. The entire wafer-level assembly 100 can be submerged in the fluid to provide at least the desirable amount of fluid at the plurality of feed ports. Where the fluid is provided to the feed port using a fluid carrier, for example a pin or capillary tube, that was dipped into fluid, an array with a plurality of such pins could be dipped into the fluid and touched onto the fill ports leaving a dollop of fluid at each of the plurality of feed ports. Alternatively, an array with a smaller number of fluid carriers, or even one fluid carrier, could be dipped into fluid and then successively touched onto fill ports until fluid is provided at the fill port of each MEMS assembly to be filled.

In an exemplary embodiment, a method for filling MEMS assemblies does not require drilling holes in the substrate or silicon wafer, which may result in increased simplicity and cost savings. The fluid containment may be accomplished virtually entirely by hermetic materials, thereby increasing reliability by reducing the risks of vapor loss from and/or air ingress into the inner cavities. The fluid filling process may occur at the wafer level. Many devices are filled at once, yielding a throughput gain.

Attaching the cover plate or plates at the wafer stage may provide protection to the active silicon MEMS structures during the manufacturing process. This may be particularly advantageous for devices where particle sensitivities are high or where the silicon contains delicate structures. Assembling the MEMS device packages or assemblies at the wafer stage may also permit fully functional testing at the wafer level. This may permit faulty parts to be identified at an early stage of the manufacturing process, thereby saving further manufacturing costs. The MEMS device and methods of this disclosure may reduce or eliminate the number of fluid interconnections and/or flexible diaphragms, resulting in fewer manufacturing steps and reduced manufacturing costs.

Providing an inner cavity with sufficiently small volume will reduce the total volumetric expansion of fluid in the fluidic MEMS device, thereby reducing the risk of leakage or other structural damage to the MEMS package due to the fluid expansion. The thermal expansion of the fluid may be entirely accommodated by deflections in the cover plate, substrate and bond ring without fracturing or damaging the packaging materials.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method of manufacturing a fluidic MEMS package comprising:
    attaching a cover plate, with a plurality of openings exposing electrical connections to a plurality of MEMS devices, to a substrate with a plurality of bond rings with breaches such that the cover plate, the substrate and the bond rings define a plurality of respective inner cavities and the cover plate, the substrate and the breaches define a plurality of respective fill ports;
    filling the inner cavities with fluid while preventing the introduction of air an/or gas into the inner cavities;
    sealing the fluid in the inner cavities;
    singulating a plurality of MEMS packages from the substrate.

2. The method of claim 1, further comprising functional testing, using the electrical connections, the plurality of MEMS device within the fluidic MEMS package prior to singulating the plurality of MEMS packages from the substrate.

3. The method of claim 1, wherein filling the inner cavities with fluid comprises:
    providing a vacuum in the inner cavity, providing an amount of fluid sufficient to fill the inner cavity at the fill port and providing pressure on the fluid to cause the fluid to fill the cavity.

4. The method of claim 1, wherein filling the inner cavities with fluid is performed prior to singulating the plurality of MEMS packages from the substrate.

5. The method of claim 1, wherein the bond ring comprises one of a glass frit, adhesive, eutectic solder, solder mask material, anodic bond, covalent bond, laser weld or Sol-gel material.

6. The method of claim 1 wherein attaching a cover plate with a plurality of openings to a substrate comprises:
    attaching a plurality of cover plates to a plurality of die locations on the surface of the substrate, the attaching being done with the plurality of respective bond rings, the plurality of openings being the space between the plurality of cover plates thereby exposing the electrical connections.

7. The method of claim 1 wherein filling the inner cavities with fluid comprises:
    purging air from the inner cavity using a purge gas;
    providing a vacuum in the inner cavity;
    at an entrance to the fill port, providing an amount of fluid at least sufficient to fill the inner cavity; and
    providing pressure on the fluid causing the fluid to fill the inner cavity.

8. The method of claim 7, wherein the purge gas has high solubility.

9. The method of claim 7, wherein the purge gas is one of carbon dioxide or helium.

10. The method of claim 7, further comprising providing a vacuum environment around the MEMS package.

11. The method of claim 10, wherein providing a vacuum environment comprises placing the MEMS package in a chamber and evacuating air from the chamber.

12. The method of claim 10, wherein providing a vacuum environment comprises assembling the MEMS package in a vacuum environment.

13. The method of claim 7, wherein providing an amount of fluid comprises submerging the MEMS package in fluid.

14. The method of claim 7, wherein providing an amount of fluid comprises touching a fluid carrier with fluid to the fill port.

15. A method of claim 1 wherein filling the inner cavities with fluid comprises:
    providing the MEMS package an evacuate port, the fill port and the evacuate port each being defined by the cover plate, the substrate and a respective one of a plurality of breaches in the bond ring;
    at an entrance to the fill port, providing an amount of fluid at least sufficient to fill the inner cavity; and
    selecting the fluid, substrate, bond ring and cover plate such that capillary forces draw the fluid into the inner cavity causing air within the inner cavity to evacuate through the evacuate port.

* * * * *

UNITED STATES PATENT AND TRADEMARK OFFICE
CERTIFICATE OF CORRECTION

PATENT NO. : 7,393,712 B2 Page 1 of 1
APPLICATION NO. : 11/350662
DATED : July 1, 2008
INVENTOR(S) : Mark A. Smith et al.

It is certified that error appears in the above-identified patent and that said Letters Patent is hereby corrected as shown below:

In column 7, line 33, in Claim 1, delete "an/or" and insert -- and/or --, therefor.

Signed and Sealed this

Eleventh Day of November, 2008

JON W. DUDAS
*Director of the United States Patent and Trademark Office*